United States Patent
Rinehart et al.

(10) Patent No.: US 7,521,789 B1
(45) Date of Patent: Apr. 21, 2009

(54) ELECTRICAL ASSEMBLY HAVING HEAT SINK PROTRUSIONS

(75) Inventors: Lawrence E. Rinehart, Lake Oswego, OR (US); Guillermo L. Romero, Phoenix, AZ (US)

(73) Assignee: Rinehart Motion Systems, LLC, Wilsonville, OR (US)

( * ) Notice: Subject to any disclaimer, the term of this patent is extended or adjusted under 35 U.S.C. 154(b) by 286 days.

(21) Appl. No.: 11/017,184

(22) Filed: Dec. 18, 2004

(51) Int. Cl.
- H05K 3/34 (2006.01)
- H05K 1/14 (2006.01)
- H05K 7/20 (2006.01)
- B23K 3/00 (2006.01)
- F28F 7/00 (2006.01)

(52) U.S. Cl. .............. 257/699; 257/E23.098; 257/704; 257/712; 257/713; 257/717; 257/720; 257/675; 361/520; 361/743; 361/699; 165/80.4

(58) Field of Classification Search ......... 257/699, 257/E23.098, 704, 712, 713, 717, 720, 675; 361/520, 743, 699; 165/80.4
See application file for complete search history.

(56) References Cited

U.S. PATENT DOCUMENTS

| | | | |
|---|---|---|---|
| 3,648,220 A | 3/1972 | Julinot | 339/17 |
| 4,281,941 A | 8/1981 | Rottenkolber | 403/29 |
| 4,427,993 A | 1/1984 | Fichot | 357/81 |
| 4,737,888 A | 4/1988 | Badnar et al. | 361/427 |
| 5,126,829 A | 6/1992 | Daikoku et al. | 357/82 |
| 5,481,136 A | 1/1996 | Kohmoto | 257/712 |
| 5,533,257 A | 7/1996 | Romero et al. | 29/890.03 |
| 5,536,972 A * | 7/1996 | Kato | 257/706 |
| 5,587,882 A * | 12/1996 | Patel | 361/705 |
| 5,644,103 A * | 7/1997 | Pullen et al. | 174/541 |
| 5,666,269 A | 9/1997 | Romero et al. | 361/699 |
| 5,751,552 A * | 5/1998 | Scanlan et al. | 361/707 |
| 5,800,958 A * | 9/1998 | Manteghi | 438/123 |
| 5,814,536 A | 9/1998 | Rostoker et al. | 438/122 |
| 5,814,880 A * | 9/1998 | Costello et al. | 257/678 |
| 5,915,463 A | 6/1999 | Romero et al. | 165/80.3 |
| 5,924,191 A | 7/1999 | Credle, Jr. et al. | 29/832 |
| 6,020,677 A | 2/2000 | Blanchet-Fischer et al. | 313/336 |
| 6,385,047 B1 | 5/2002 | McCullough et al. | 361/704 |
| 6,583,505 B2 * | 6/2003 | Choi | 257/730 |
| 6,635,339 B1 | 10/2003 | Adler et al. | 428/307.7 |
| 6,635,958 B2 * | 10/2003 | Bates et al. | 257/703 |
| 6,655,449 B1 | 12/2003 | Hsien | 165/80.4 |
| 6,911,728 B2 * | 6/2005 | Ishikawa et al. | 257/706 |
| 6,919,504 B2 * | 7/2005 | McCutcheon et al. | 174/16.3 |
| 7,173,823 B1 * | 2/2007 | Rinehart et al. | 361/699 |
| 7,342,803 B2 * | 3/2008 | Inagaki et al. | 361/763 |
| 2002/0157859 A1 | 10/2002 | Vasoya et al. | 428/307.7 |
| 2002/0171134 A1 * | 11/2002 | Choi | 257/678 |
| 2002/0191378 A1 * | 12/2002 | Suzuki et al. | 361/704 |
| 2003/0102553 A1 * | 6/2003 | Ishikawa et al. | 257/707 |
| 2003/0186483 A1 * | 10/2003 | Choi | 438/106 |
| 2003/0200836 A1 * | 10/2003 | Amita et al. | 75/255 |
| 2004/0016748 A1 * | 1/2004 | Kinoshita et al. | 219/552 |

(Continued)

*Primary Examiner*—Alexander O Williams
(74) *Attorney, Agent, or Firm*—Timothy E. Siegel Patent Law, PLLC

(57) ABSTRACT

An electrical assembly, comprising a heat producing semiconductor device supported on a first major surface of a direct bond metal substrate that has a set of heat sink protrusions supported by its second major surface. In one preferred embodiment the heat sink protrusions are made of the same metal as is used in the direct bond copper.

9 Claims, 4 Drawing Sheets

U.S. PATENT DOCUMENTS

2005/0077618 A1* 4/2005 McCutcheon et al. ....... 257/712
2005/0122018 A1* 6/2005 Morris ........................ 313/46
2005/0167849 A1* 8/2005 Sato ........................... 257/778

* cited by examiner

ELECTRICAL ASSEMBLY HAVING HEAT SINK PROTRUSIONS

STATEMENT OF GOVERNMENT SUPPORT

This invention was made with government support under grant no DE-FG02-03ER83768, awarded by the Department of Energy. The government has certain rights in the invention.

BACKGROUND OF THE INVENTION

One critical problem encountered in the design of power circuitry (and other heat producing circuitry) is the need to dissipate heat created. A 10° C. decrease in operating temperature typically has the effect of doubling the life expectancy of the circuitry, and is accordingly, highly desirable.

Unfortunately, a number of difficult problems arise in the design of a heat sink for power circuitry. First, silicon has a coefficient of thermal expansion ("CTE") of approximately 2. For many semiconductor packaging materials, the thermal expansion is positively related to thermal conductivity. So, most highly conductive materials, such as copper and aluminum, also have a high COTE. One exception, diamond, is expensive and very hard, making it difficult to form into a desired shape. Although diamond dust can be used, typically mixed with aluminum, this also proves expensive and difficult to cast. Another challenge is the need to maintain electrical isolation between the electrical devices and heat sinking structure.

Over time, a number of innovations have been developed to address the problem of expressing heat from power circuitry, while meeting other important requirements. First, direct bond metal ("DBM") substrates and more specifically direct bond copper (DBC), have been developed. In a DBC substrate, a planar piece of ceramic is bonded with copper on both sides in a direct chemical bond process. One side is referred to as the circuit side, the opposite side is referred to as the free side. The strength of this bond prevents the differing CTE of the copper versus the ceramic from causing separation. The copper is constrained by the ceramic, causing the DBC as a whole to have a CTE of about 11, much closer to that of silicone than copper alone, which has a CTE of 17.

On the circuit side, the copper cladding of the DBC is divided into sections, so that the various terminals of the power circuitry are not shorted together. This design must be done very carefully, to prevent a fracture of the ceramic, caused by the compressive stress of the copper as it bonds and as it later compresses when cooled. DBC provides fairly good heat dissipation because heat easily spreads laterally through the copper and then spreads through the thin ceramic in an even manner. Expressing the heat from the free side of the DBC can be a problem because of the large amount of heat being conducted to the free side.

One problem that occurs in the production of electric assemblies is that of rigidly connecting to a housing a rigid conductive member that has been flow soldered to a component. Typically, a rigid conductive member of this kind defines an aperture that, after preliminary assembly, is screwed to a threaded hole in the housing. The member also defines a further aperture or apertures, designed to facilitate further electrical connections at the time the assembly is placed in service. These operations, however, tend to torque the rigid conductive member, as it is being secured, and this places a shear forces onto the solder bond, weakening it. Also, it is typical to hold the rigid conductive member with a first bracket during assembly, and then attach it to a housing, distinct from the first bracket, toward the end of assembly. This requires a certain amount of work and materials, to provide the first bracket, and then the housing part to which the rigid conductive member attaches in final assembly.

SUMMARY OF THE INVENTION

The present invention is an electrical assembly, comprising a heat producing semiconductor device supported on a first major surface of a direct bond metal substrate, which has a set of heat sink protrusions supported by its second major surface.

The foregoing and other objectives, features and advantages of the invention will be more readily understood upon consideration of the following detailed description of the preferred embodiment(s), taken in conjunction with the accompanying drawings.

DETAILED DESCRIPTION OF THE PREFERRED EMBODIMENT(S)

Figure 1:
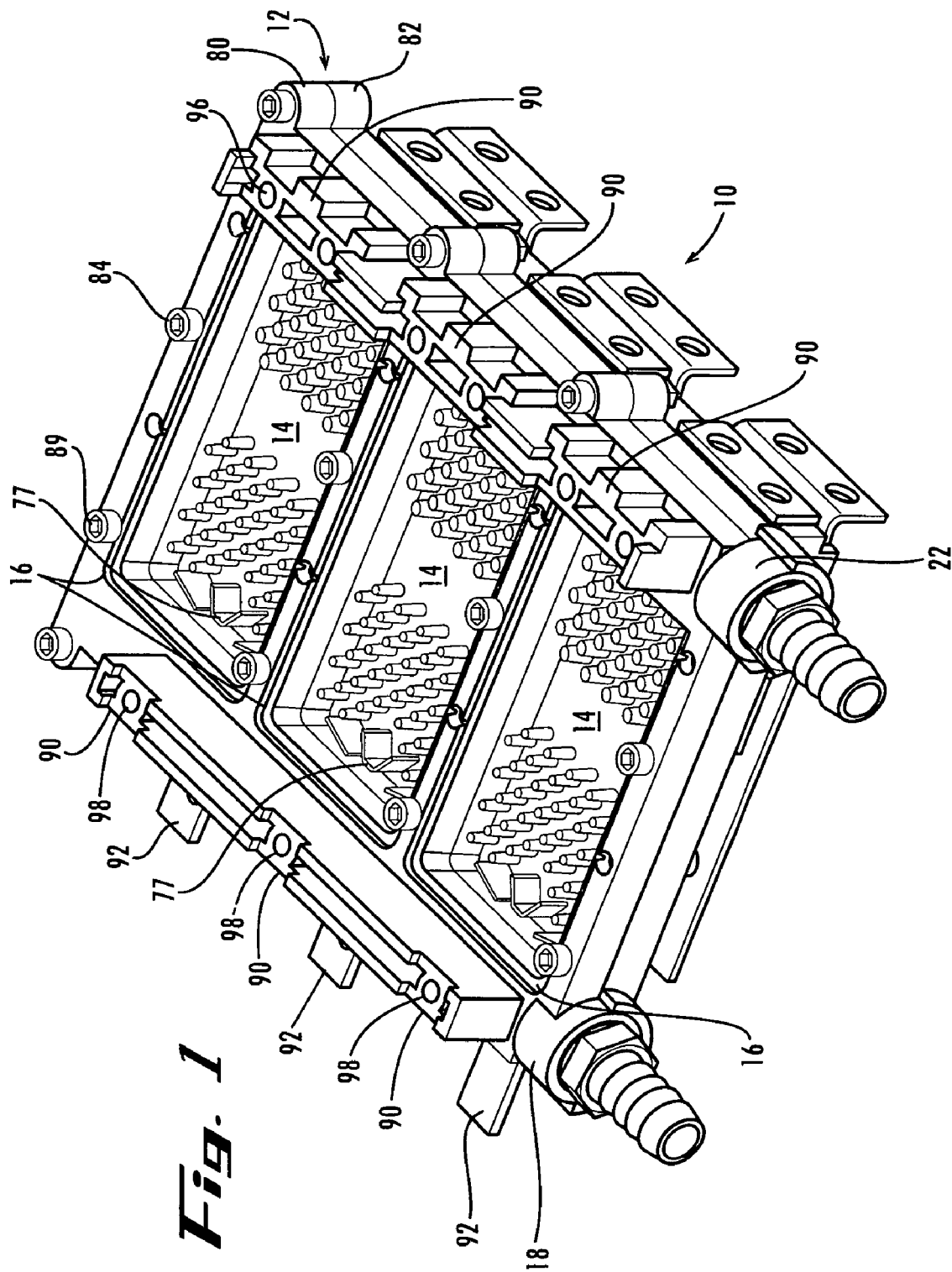
FIG. 1 is a perspective of a portion of a power assembly according to a preferred embodiment of the present invention.
Figure 5:
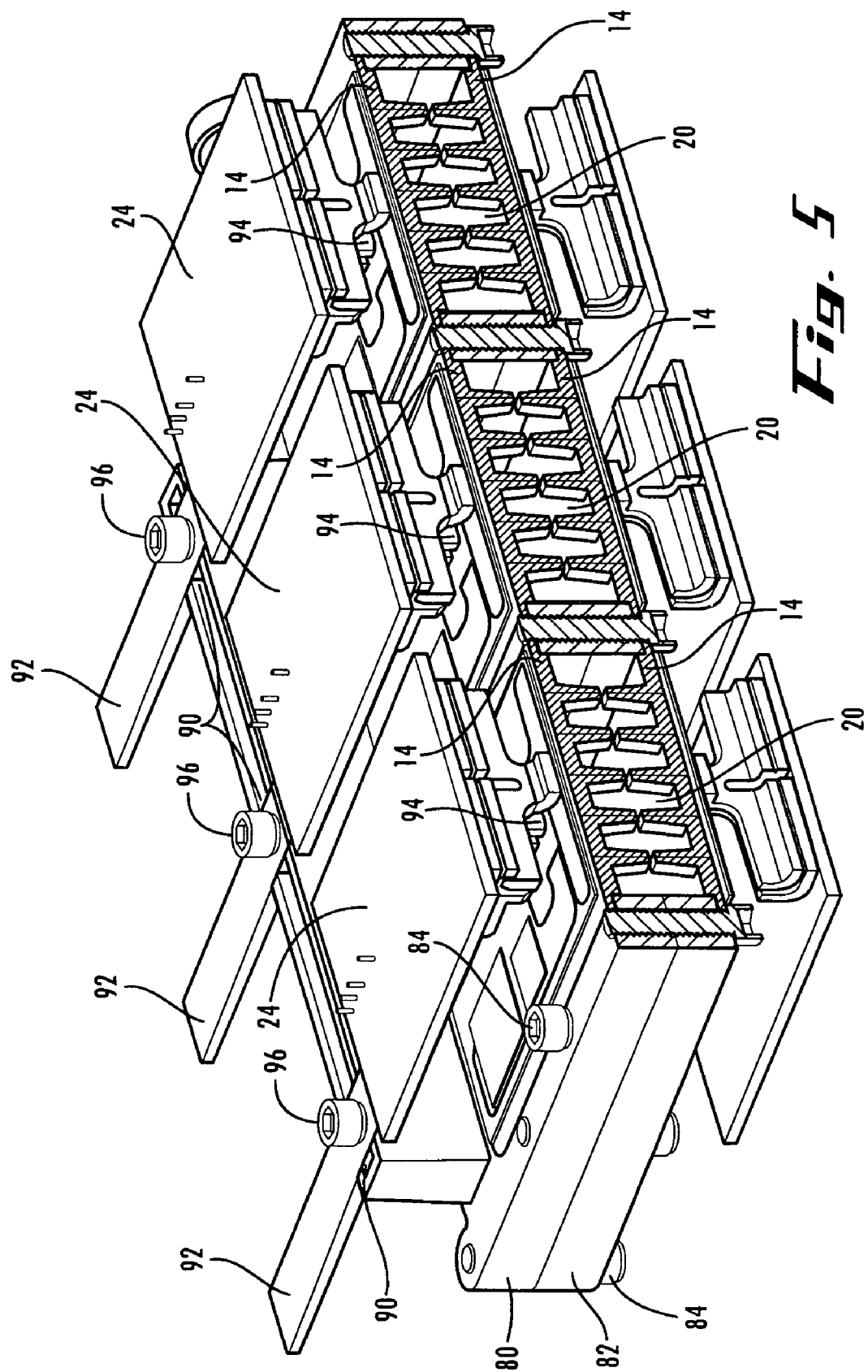
FIG. 5 is a perspective, sectioned view of the power assembly that is partially shown in FIG. 1.

Referring to FIG. 1 a preferred embodiment of a power assembly according to the present invention is a power assembly 10 made of a housing 12 that is adapted to accept and retain a set of six power circuit packages 14. Three packages 14 fit into a set of openings 16 on the bottom side of housing 12, and three additional packages 14 fit into additional openings 16 on the top side of housing 12. Housing 12 also accepts liquid coolant through fluid inlet 18, guides it into a set of three flow volumes 20 (FIG. 5), each defined by housing 12 and a top and bottom package 14. The liquid coolant is guided out again through fluid outlet 22. For each power package 14, a connective/structural unit 24 (FIG. 5) brings electricity to and takes electricity from the package 14 and helps to retain package 14 in place.

Some advantages of the above described assembly 10 should be apparent to skilled persons. By providing a housing 12 that receives and retains a set of circuit packages 14 (FIG. 5), the size of any one circuit package 14 is kept to a reasonable minimum given the power density (about 4 cm×8 cm), thereby minimizing the problem of removing heat from the package 14. Also, the package 14 is unitary, although as described below it may be structurally complex, and is placed into direct contact with the liquid coolant (not shown). Unlike the previous practice, this facilitates heat flow by avoiding the placement of structural elements between the heat producing package 14 and the heat removing liquid coolant.

Figure 2:
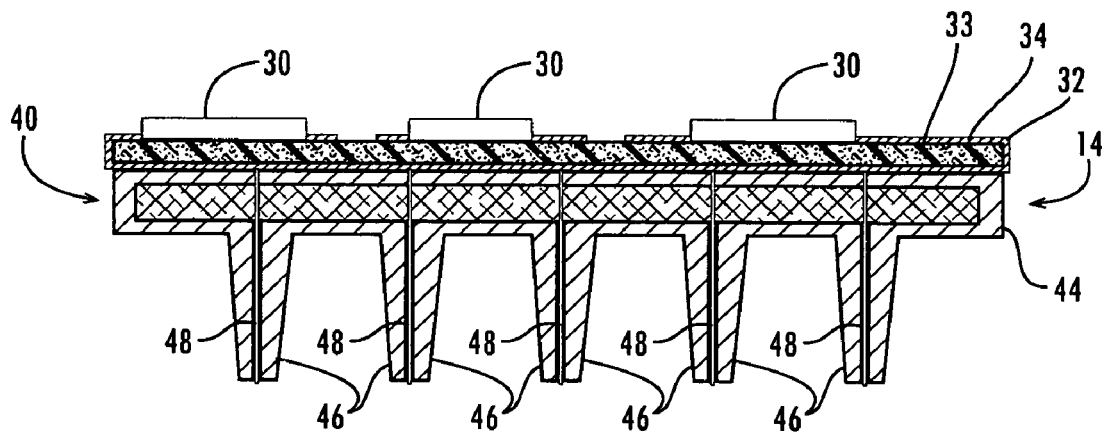
FIG. 2 is a side cross-sectional view of a power package that forms a part of the power assembly of FIG. 1.

Referring to FIG. 2, in greater detail, each heat producing electrical package 14 is made up of a set of electrical components 30, at least a subset of which are heat producing, physically and electrically connected to a direct bond copper (DBC) substrate 32. This substrate 32 is on the order of only about 1 millimeter thick, including a 300 to 600 micron ceramic center 33, with 250 to 300 microns of copper 34 joined to either side. The ceramic center 33 is either silicon nitride, alumina or aluminum nitride. As silicon nitride is very strong, a silicon nitride DBC center 33 would typically be about 300 microns thick, whereas an alumina or aluminum nitride center part 33 would be about 600 microns thick.

The copper film 34 that forms the component-side of the DBC is etched into sections, to avoid having one component terminal electrical connected to another. As noted in the Background section, however, this creates a fundamental problem, in the structural integrity of the DBC substrate. The copper, as it is directly (chemically) bonded to the ceramic at high temperature exerts a compressive strain onto the ceramic upon cooling, and unless this strain is evenly distributed, the ceramic may crack or warp while the copper is being sectioned. Accordingly, the comparatively small size of each package 14 helps to address the practical problem of achieving DBC structural integrity.

On the DBC major surface opposed to the component surface, a heat sink structure 40 is attached by a layer of solder (not shown). Structure 40 includes a body 44 made of aluminum cast within and about a silicon-carbide matrix, to restrain its thermal expansion. Depending outwardly from the bottom of portion 44 are a set of protrusions 46. In one preferred embodiment the silicon-carbide matrix does not extend into protrusions 46, which are cast of aluminum in the same mold as portion 44. Each protrusion 46 includes a thin central void into which are placed pyrolitic carbon fibers 48. Fibers 48 extend from the free end of each protrusion 46 up through body 44 so as to be in intimate contact with the DBC substrate surface opposite the component side. Fibers 48 are extremely thermally conductive, thereby helping to conduct heat towards the free end of each protrusion 46. In this manner each protrusion is maintained in a state in which heat is emitted over its entire length, as opposed to simply at its base.

Figure 4:
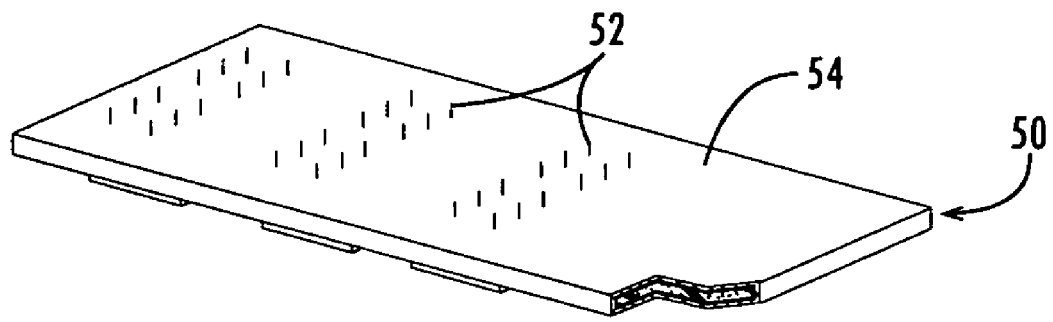
FIG. 4 is a perspective, cut-away view of an alternative embodiment of a power package that could form a part of a power assembly, otherwise similar to that shown in FIG. 1.

Referring to FIG. 4, in an alternative embodiment a set of electrical packages, such as electrical package 50 are used instead of electrical packages 14. In package 50 heat emanating pins 52 protrude from the DBM substrate 54. Typically, both pins 52 and outer coating of substrate 54 are made of copper. Each pin 52 has a relatively small cross-sectional area, and thereby has a correspondingly small joint area with substrate 54, so that the problems caused by the thermal expansion mismatch between substrate 54 (constrained by its ceramic core) and each pin is minimized.

Figure 4B:
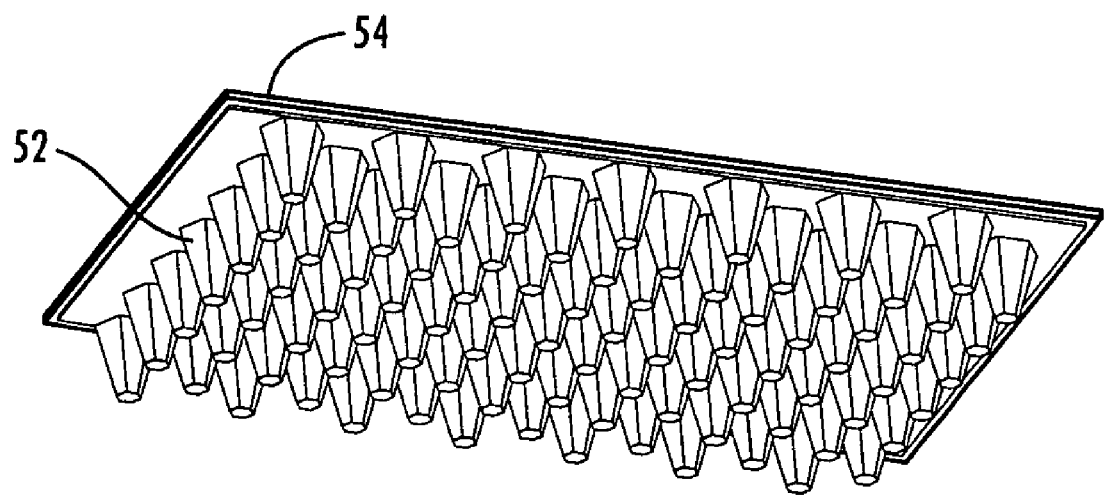
FIG. 4B is a perspective view of an alternative embodiment of the power package of FIG. 4.

Referring to FIG. 4B, in a preferred embodiment, pins 52 may be of hexagonal shape at their base, and tapered to a smaller hexagonal shape at their free end. This construction allows both for full area contact with heat producing DBM substrate 54, as well as for minimal pressure drop caused by the fluid flowing past the pins 52'.

Figure 3:
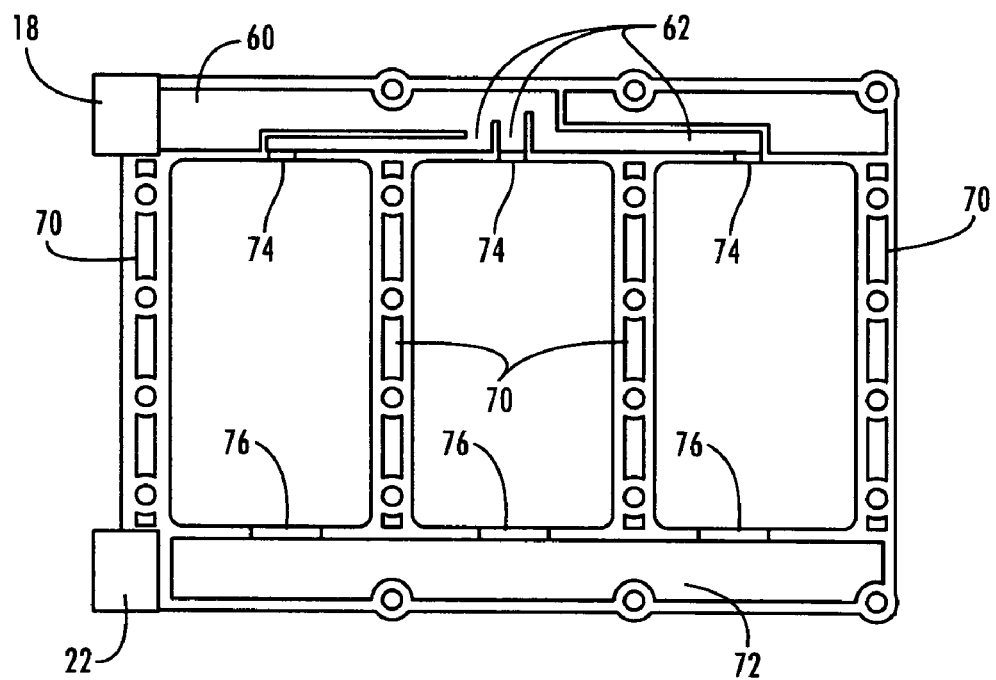
FIG. 3 is a cross-sectional view of a housing that forms a part of the power assembly of FIG. 1.

Turning now to the housing 12 (best shown in FIG. 3), fluid inlet 18 leads directly to an inflow tube 60, which is divided into three flow passages 62 collectively designed to split a flow of liquid coolant into three parts having mutually equal flow rates. Each of flow passages 62 leads to a flow volume 20 (FIG. 5), defined above as being defined by housing 12 and upper and lower packages 14. More specifically, each flow volume 20 is a space defined by upper and lower packages 14, two ribs 70 of housing 12 and the exterior sides of inflow tube 60 and an outflow tube 72. An entry port 74 and exit port 76, permit coolant to flow into each flow volume 20 from a flow passage 62 and out again into the outflow tube 72. A set of flow deflectors 77 (FIG. 1), cause the coolant to flow fairly equally in all sections upon entering flow volume 20.

Returning, briefly to packages 14, protrusions 46 are thinner on the side of package 14 that is closer to entry port 74 than on the side closer to exit port 76. The coolant is cooler when it first enters, thereby maintaining the exterior of each protrusion 46 in a cooler state. Accordingly the thermal gradient through protrusion 46 is greater, and the base can be maintained at a cooler temperature, despite the narrow size. To get the same heat sink effect, it is necessary to have thicker protrusions 46 in the area in which the coolant has been warmed up by protrusions 46 that have been already encountered.

In some instances, it is necessary to keep an entire electrical network at a similar temperature, to avoid switching time differences caused by differing component temperatures from throwing the operation of the network out of kilter. It is an advantage of this preferred embodiment that protrusions 46 can be sized and arranged to maintain an entire electrical network at a fairly similar temperature during operation.

Housing 12 is preferably made of a first piece 80 and a second piece 82 of injection molded polymeric resin. The two pieces 80 and 82 are joined together by a series of bolts 84 that mate with threaded holes in pieces 80 and 82. This method of manufacture is inexpensive and robust, with the two molds being largely identical, except for the nesting parts near fluid inlet 18 and outlet 22. An alternate joining method may be with adhesive or adhesive in combination with snap fit features in housing 12.

Housing 12 includes a set of brackets 90 that are specially made so that they both facilitate production of assembly 10 and help assembly 10 to remain intact and sturdy after production is finished. Brackets 90 support rigid conductive members 92 while rigid conductive members 92 are being flow soldered to their mating components 94. To withstand the heat (240° C.) at which flow soldering must be conducted, housing 12 is made of a sufficiently heat resistant molded polymer. After flow soldering, conductive members 92 will be in their final position, and it is necessary to affirmatively bind rigid conductive members 92 to the housing, so that assembly 10 will be structurally robust. This is accomplished by placing a bolt 96 through an aperture (not shown) defined in member 92 and tightening it into a matching threaded hole 98 defined in housing 12. For this operation, brackets 90 constrain rigid conductive members 92 from rotating, thereby, preventing a shear stress from being placed on the solder bond, as has been a problem in the prior art.

In operation, the liquid coolant that is pushed into inlet 18 is either water, oil, ethylene glycol, or a mixture of water and ethylene glycol. It is pushed through at a rate sufficient to absorb the heat lost from the circuitry. The terms and expressions that have been employed in the foregoing specification are used as terms of description and not of limitation. There is no intention, in the use of such terms and expressions, of excluding equivalents of the features shown and described or portions thereof, it being recognized that the scope of the invention is defined and limited only by the claims which follow.

The invention claimed is:

1. An electrical assembly, comprising:
   (a) a heat producing semiconductor device;
   (b) a direct bond metal substrate having a ceramic core and first and second metal coated major surfaces and supporting said heat producing semiconductor device on said first major surface; and
   (c) a set of protrusions each supported directly by said second major surface each being made of thermally conductive material so as to act as a heat sink.

2. The electrical device of claim 1 wherein said protrusions are made of metal.

3. The electrical device of claim 2 wherein said protrusion are made of metal of like type to said metal of said direct bond metal layer of said second major surface.

4. The electrical device of claim 1 wherein said direct bond metal is copper.

5. The electrical device of claim 1 wherein each said protrusion is attached to said direct bond metal over an area of less than 0.1 cm$^2$.

6. The electrical device of claim 1 wherein each said protrusion is attached to said direct bond metal over an area of less than 0.01 cm$^2$.

7. The electrical device of claim 1 wherein each said protrusion is attached to said direct bond metal over an area of less than 0.001 cm$^2$.

8. The electrical device of claim 1 wherein each said protrusion is attached to said direct bond metal over an area of less than 0.0001 cm$^2$.

9. The electrical device of claim 1 wherein each said protrusion is attached to said direct bond metal over an area of less than 0.00001 cm$^2$.

* * * * *